(12) United States Patent
Rolfson

(10) Patent No.: US 6,521,049 B1
(45) Date of Patent: Feb. 18, 2003

(54) METHOD FOR REDUCING GASEOUS SPECIES OF CONTAMINATION IN WET PROCESSES

(75) Inventor: J. Brett Rolfson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/327,152

(22) Filed: Jun. 7, 1999

Related U.S. Application Data

(63) Continuation of application No. 08/724,578, filed on Sep. 30, 1996, now Pat. No. 6,001,189.

(51) Int. Cl.⁷ .............................. B08B 3/04; B08B 7/04
(52) U.S. Cl. ........................ 134/10; 134/21; 134/34; 134/109; 134/902
(58) Field of Search .................. 134/10, 21, 25.1, 134/25.4, 26, 34, 109, 902; 96/133; 93/241; 438/800, 906; 210/600, 199

(56) References Cited

U.S. PATENT DOCUMENTS

| | | | | |
|---|---|---|---|---|
| 3,964,957 A | | 6/1976 | Walsh | 156/345 |
| 5,190,064 A | * | 3/1993 | Aigo | 134/84 |
| 5,383,483 A | * | 1/1995 | Shibano | 134/111 |
| 5,645,727 A | | 7/1997 | Bhave et al. | 210/651 |
| 5,806,543 A | * | 9/1998 | Ohmi | 134/61 |
| 5,842,491 A | * | 12/1998 | Han et al. | 134/44 |
| 5,979,474 A | * | 11/1999 | Manako | 134/102.1 |
| 6,001,189 A | * | 12/1999 | Rolfson | 134/10 |
| 6,021,791 A | * | 2/2000 | Dryer et al. | 134/100.1 |

FOREIGN PATENT DOCUMENTS

EP  0 810 643 A2  12/1997  ......... H01L/21/306

OTHER PUBLICATIONS

CFM Technologies, printout of internet web site (*http://www.cfmtech.com/tech.html*) (Nov. 20, 1998).

Yasuyuki Yagi, et al., Advanced Ultrapure Water Systems with Low Dissolved Oxygen for Native Oxide Free Wafer Processing, IEEE Transactions on Semiconductor Mfg., May 1992, vol. 5, No. 2 at 121–127.

* cited by examiner

*Primary Examiner*—Randy Gulakowski
*Assistant Examiner*—Saeed Chaudhry
(74) *Attorney, Agent, or Firm*—Charles Brantley

(57) ABSTRACT

A method for wet processing of a semiconductor-containing substrate that reduces contamination in the wet process by removing undesired sources of gas contamination, the method comprising: pumping a processing liquid through a degasifier, exposing the semiconductor wafer, in a vessel, to the degasified processing liquid; and optionally recirculating the processing liquid through the degasifier and back into the vessel.

15 Claims, 1 Drawing Sheet

US 6,521,049 B1

METHOD FOR REDUCING GASEOUS SPECIES OF CONTAMINATION IN WET PROCESSES

RELATED APPLICATION

This application is a continuation of application Ser. No. 08/724,578, filed Sep. 30, 1996 now U.S. Pat. No. 6,001,189.

BACKGROUND OF THE INVENTION

1. Technical Field

The present invention relates to a method for reducing contamination in wet processing of semiconductor substrates. More particularly the invention relates to a method to remove unwanted sources of gas contamination from a wet process fabrication step in the manufacture of semiconductor devices.

2. Background

A large variety of thin films are used in the fabrication of semiconductor devices. Current design rules for integrated circuits (ICs) demand that many features be reduced to submicron levels resulting in, for example, smaller linewidths and higher aspect ratio contact holes. These submicron size demands impact the specifications and requirements of many of the fabrication processes. The flatness of a wafer must be tightly maintained throughout the entire fabrication process in order to allow such increasingly fine and microscopic geometric features to be precisely printed. Every layer deposited on the top surface of the wafer that possesses irregularities and variations in its uniformity has an adverse affect during all subsequent processing steps that the wafer undergoes. Uniformity of the layers has become a critical factor in semiconductor wafer production. It is, therefore, essential that the wafer surface be as clean and well conditioned as is technically possible before each fabrication process in order to obtain the precision and high yields in semiconductor fabrication.

To accomplish these fabrication goals, wet process wafer cleaning and etching procedures are carried out prior to many process steps. An important change in light of these factors is a need for dramatic improvement in contamination control. Contamination control includes, for example, reducing the particulate matter present and the purity of the grade of chemicals used in IC manufacture. There is a direct correlation between device yield and performance with the purity of the chemicals used to fabricate the device. This direct correlation between defects and chemical purity spotlights the need to increase the purity of the chemicals used in all of the fabrication processes, as a means to reduce contamination.

The potential exists to decrease contamination, lower defect density and increase chemical purity over that which can be obtained by simply purchasing the highest purity grade of chemicals available. Even slight improvements in defect density, and therefore device performance, are likely to enable considerable cost savings. A significant use of chemicals in IC fabrication occurs in wet processing steps, such as wafer cleaning and wet etching processes. Wet chemical surface preparation methods have been the preferred techniques for many wafer processing methods for the last 30 years and are likely to have wide popularity and application for the foreseeable future. Wet chemical cleaning technologies are favored because of many inherent properties of aqueous solutions, such as the high solubility of metals, etc.

There are also recognized disadvantages associated with current wet chemical surface preparation methods. For example, to minimize the problems associated with contamination, chemicals are being replaced frequently, thereby generating large amounts of chemical wastes. Stringent environmental regulations decrease the options for disposing of these chemicals. Legislation like the Clean Air and Water Acts, Pollution Prevention Act Resource Conservation and Recovery Act, Source Reduction and Hazardous Waste Management Review Act, Hazardous and Solid Waste Amendment etc., prohibit easy off-site disposal of these chemicals. Difficulty in disposal makes the option of simply introducing a steady stream of unused, high purity chemicals problematical and contributes to escalating cost, etc. Some of these environmental, safety and health issues are being addressed by reducing the concentration of liquid based chemicals, process improvements and equipment improvements, as well as the recycling of chemicals. There is an ongoing need for new, improved and innovative processes that address many of these challenges.

One resolution that has been tried to control contamination in wet chemical processes is to have the chemical generation system located very close to the wet station, but still beyond the boundaries of the cleanroom area itself This proximity to the wet station for the creation of the chemicals is believed to improve their purity.

Closer to the wet chemical processes, there are other steps that can be examined and changed, for example, how often the tank in the wet benches or wet station must be dumped and refilled, the amount of recirculation that should be tolerated and other protocols that should be considered, such as the injection of ozone to help keep the bath fresh. Another very important factor to be considered is whether or not using filters will positively affect the process, and if so where in the processes should those filters be utilized. Generally, filters are not used with point-of-use (POU) chemical delivery systems. These delivery systems use clean piping and valves that minimize the generation of particles and make POU filtration unnecessary, the belief being that point-of-use filtration is not necessary if the wet bench is fed by a properly designed bulk chemical distribution system. On the other hand, filters are widely used with recirculated bath applications. Here, particles are generated by the processing of wafers and must be removed to prevent their adherence to the wafer surface.

What benefit filters ultimately confer is a point of controversy in many semiconductor processes. Filtration by its nature, can remove particles that are present in the chemical, but cannot ensure purity. A filter can function to prevent introduction of further extractable species (ionic or organic) to that chemical, but cannot upgrade the starting level of purity for a chemical substance passing through the filter. Under some operating conditions, filters can actually add to the particulate contamination. For example bacteria trapped in a filter can actually break up in small pieces and be jettisoned through to the clean side of the filter, increasing rather than decreasing the amount of particulate contamination present.

Overall, the use of filters and POU chemical systems help reduce the problem of particle contamination in the liquids used in semiconductor fabrication. There is an existing need for new, improved processes that address the issue of contamination by gaseous species in processing liquids.

SUMMARY OF THE INVENTION

The present invention is a method for wet processing of a semiconductor-containing element or wafer that reduces contamination in the wet process by removing undesired sources of gas contamination, the method comprising: pumping a processing liquid through a degasifier, exposing the semiconductor element to the degasified processing liquid; and optionally recirculating the processing liquid through the degasifier and returning it for exposure to the same or different semiconductor element. Additional advantages and novel features of the invention will be set forth in part in the description that follows, and in part will become apparent to those skilled in the art upon examination of the following or may be learned by practice of the invention. The advantages of the invention may be realized and attained by means of the instrumentalities and combinations particularly pointed out in the appended claims.

DETAILED DESCRIPTION OF THE INVENTION

Figure 1:
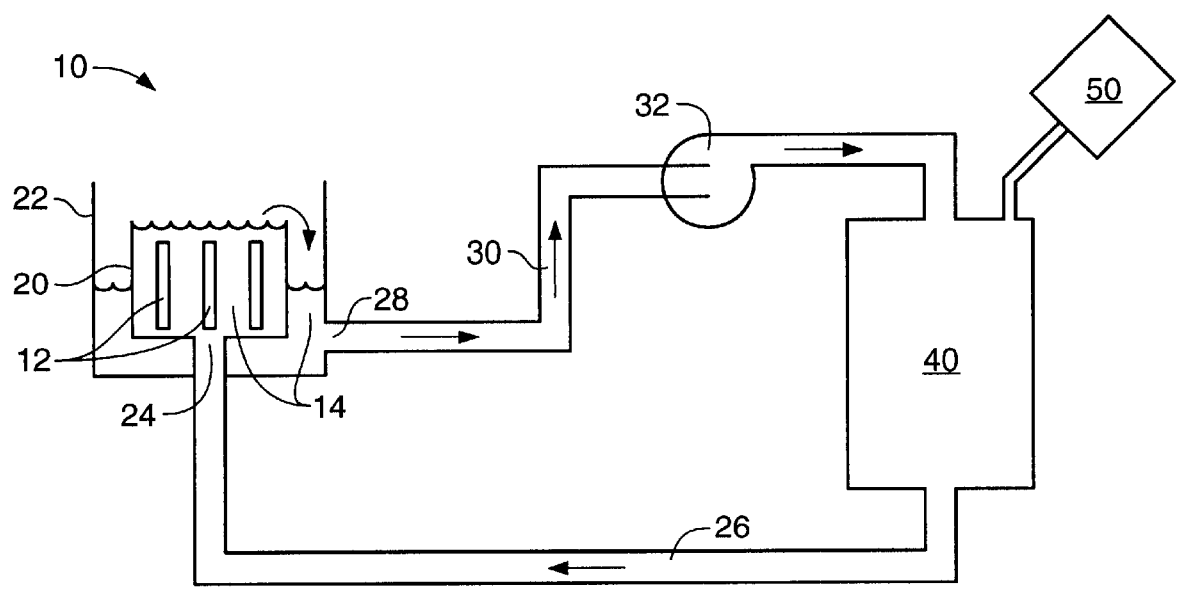
FIG. 1 is a schematic drawing of an exemplary wet processing system suitable for use with the method of this invention.

The present invention, broadly stated, is directed to a method for wet-chemical processing of a semiconductor-containing substrate or element, preferably a wafer or workpiece. The method can be used for any desired wet-chemical process, such as wet chemical etching, washing or other surface conditioning treatments of the element. The method of the present invention, generally, is comprised of the following steps: pumping a processing liquid through a degasifier, exposing the semiconductor element to the degasified processing liquid; and optionally recirculating the processing liquid through the degasifier and returning it for exposure to the same or a different element.

This method can be practiced with any wet chemical processing system, but will be particularly beneficial in systems that utilize a recirculation scheme for the chemicals used. A typical wet processing system that can be used with this method is shown schematically in FIG. 1 and is generally designated as 10. A wet chemical process setup such as the one shown schematically in FIG. 1 is often referred to commercially as a wet bench or wet station. The main features of wet station 10 generally include process vessel or tank 20, overflow tank 22, pump 32 and degasifier 40; all of which are in appropriate fluid communication by a series of conduits, described in more detail below.

Specifically, in an exemplary embodiment, system 10 is supplied with chemical processing liquid 14 from an initial source (not shown), after which liquid 14 can be recirculated through system 10 as desired. Liquid 14 is forced through degasifier 40, here by liquid pump 32. Optionally, depending on the type of degasifier used, vacuum pump 50 can also be used to improve the performance of degasifier 40. Within degasifier 40 any gases entrained in liquid 14 are removed and degasified processing liquid 14 continues out of degasifier 40 to be returned to process tank 20 by way of conduit 26. Liquid 14 is introduced into process tank 20 in an upwelling manner through inlet 24. By upwelling it is meant introducing liquid from below the existing surface of liquid 14. By introducing liquid 14 into tank 20 in an upwelling manner, further introduction of gases into liquid 14 by bubbling, splashing, etc. is avoided.

Semiconductor workpiece 12 can be any appropriate substrate, such as silicon-on-insulator substrates, semiconductor wafers, substrates having one or more semiconductor layers or structures which includes active or operable portions of semiconductor devices, and the like. Here, workpiece 12 is here a semiconductor wafer and is exposed to degasified liquid 14 in processing tank 20. Liquid 14 is then recirculated through system 10. The recirculation path for liquid 14 includes overflowing from process tank 20 into overflow tank 22 and exiting overflow tank 22 through exhaust portal 28 into overflow conduit 30 and return to degasifier 40 through the action of pump 32. Liquid pump 32 is, in this example, located downstream of process and overflow tanks 20 and 22, respectively and upstream from degasifier 40, but can be located in either leg of the recirculation loop. After passing through degasifier 40, liquid 14 continues through the recirculation loop as described above; briefly, liquid 14 is returned in an upwelling fashion to process tank 20 by way of conduit 26.

Degasifier 40 can be any suitable degasifier possessing suitable characteristics, for example, a vacuum degasifier with adequate pumping force for the system it is incorporated into, as well as filter or membrane pore size to allow liquid 14 to be sufficiently degasified. By degasifier it is meant any suitable means of removing gases entrained in liquid 14. Examples of suitable degasifiers include, but are not limited to, dialysis membranes, ultrafiltration filters, pervaporation techniques and the employment of forced-draft carbononators and vacuum degasifiers and membrane contactors. In the described embodiment degasifier 40 is a Liqui-Cel® membrane contactor made by Hoechst-Celanese Corp.

Determination of the specific amount of recirculation of liquid 14 would depend upon the specific fabrication operation being employed, the flow rate of liquid 14 and character of the chemical liquid(s) used for the specified operation. For example, in a cleaning process using ammonium hydroxide and hydrogen peroxide, exhaustion of the hydrogen peroxide might be the limiting factor in determining the level of recirculation that is acceptable. Whereas in a process such as a wet etch with hydrofluoric acid (HF) the amount of particulate matter generated by the etching process or the resultant surface roughness of workpiece 12 might be the overriding determinant.

Generally, with most types of degasifiers, it is believed that any entrained gases are removed by being drawn out through pores of a filter or membrane that is selectively permeable to gases and not liquids. In this way liquid 14 essentially stays in system 10, while the removed and unwanted gas species are selectively removed from recirculating liquid 14 as liquid 14 flows through degasifier 40.

An important consideration in improving contamination control is that although semiconductor Manufacturing is almost universally carried out in cleanrooms, they are "clean" rooms only in terms of particle contamination in the atmosphere. Contamination in the form of gaseous impurities is not a recognized problem in cleanroom protocols. Very few cleanrooms used in semiconductor manufacturing are equipped with charcoal filters in the cleanroom air filtration system to remove gaseous impurities from the ambient air being supplied to the buildings, such as the products of atmospheric reactions producing smog, including ozone, nitrous oxide, carbon monoxide, and sulfur dioxide. As a result, gaseous impurities such as these can be present in the cleanroom in concentrations roughly equivalent to the local atmosphere. Likewise, it is recognized that the chemical reactions in a wet process exhaust certain constituents of the processing liquid and therefore reduce the efficacy of the process of interest, but it has not been recognized that the process itself can be a source for generation of gaseous contamination. Gas phase contaminants in the form of chemical reaction by-products or ambient in the clean room have the potential to become dissolved in the liquid process chemicals at the wet station and become a source of chemical contamination and impurity. As such, these gaseous contaminants can adversely affect such important parameters as the surface roughness of the various layers on the IC, the chemical composition of a layer and the overall defect density for a given device.

The use of degasifier 40 in system 10 possessing a recirculation loop provides unexpected advantages by significantly reducing gas contamination in recirculating baths. Wet processing systems with recirculation are extremely likely to introduce gases present in the ambient air into processing liquid 14 as a result of the overflowing or spillover from processing tank 20, representing a constant introduction of contaminating gases. Air quality in most areas contains specie that are undesirable if introduced into liquid 14, such as smog-like contaminants including automotive exhaust products which are almost globally present and are certainly present at any semiconductor fabrication site by virtue the site being the destination of workers and vendors traveling by vehicle. It has also been shown that decomposition of chemical compounds commonly used in wet process, such as ammonium hydroxide and hydrogen peroxide used in wafer cleaning solutions, can create unwanted gases which cause surface roughness on a silicon wafer. Likewise, commonly dissolved gases, especially oxygen and carbon dioxide are known to add unwanted contaminants to wafer surfaces and layers. Contamination tolerances are necessarily decreasing with the new submicron dimensions and features to ensure device performance required for current and future electronic devices. This method permits significant decrease in contamination levels in and wet processing through degasification of the processing liquid prior to wafer exposure.

While there is shown and described an exemplary embodiment of the invention, it is to be distinctly understood that this invention is not limited thereto but may be variously embodied to practice within the scope of the following claims.

I claim:

1. A method of circulating a processing fluid, comprising:
   exposing said fluid to an atmosphere within a semiconductor fabrication facility, wherein said step of exposing said fluid to an atmosphere comprises exposing said fluid to a cleanroom atmosphere;
   directing said fluid from said atmosphere to a degasifier within said semiconductor fabrication facility; and
   directing said fluid from said degasifier to a workpiece.

2. The method in claim 1, wherein said step of exposing said fluid to a cleanroom atmosphere comprises exposing said fluid to a wet bench atmosphere.

3. A process for treating a semiconductor workpiece, comprising:
   supplying a chemical to a wet processing system;
   allowing an introduction of a product of an atmospheric reaction into said chemical;
   removing said product from said chemical while said chemical is within said wet processing system; and
   exposing said workpiece to said chemical.

4. The process in claim 3, wherein said step of allowing an introduction comprises allowing said introduction subsequent to said step of supplying a chemical.

5. The process in claim 3, wherein said step of allowing an introduction comprises allowing an introduction of said product into said wet processing system.

6. A method of regulating a treatment system for a semiconductor workpiece, comprising:
   introducing a liquid into said treatment system;
   allowing a chemical reaction to occur within said treatment system, wherein said step of allowing a chemical reaction to occur within said treatment system comprises allowing a decomposition of a chemical compound used in said treatment system;
   exposing said liquid to a constituent formed from said chemical reaction, wherein
      said step of exposing said liquid to a constituent comprises exposing said liquid to a gas formed from said decomposition;
   removing said constituent from said liquid at a point proximate to that of said act of exposing;
   directing said liquid toward said semiconductor workpiece;
   exposing said liquid to an additional amount of said constituent after said step of directing said liquid;
   removing said additional amount of said constituent from said liquid; and
   redirecting said liquid toward said semiconductor workpiece.

7. A method of regulating a treatment system for a semiconductor workpiece, comprising:
   introducing a liquid into said treatment system;
   allowing a chemical reaction to occur within said treatment system, wherein said step of allowing a chemical reaction to occur within said treatment system comprises allowing a decomposition of a chemical compound used in said treatment system;
   exposing said liquid to a constituent formed from said chemical reaction, wherein said step of exposing said liquid to a constituent comprises exposing said liquid to a gas formed from said decomposition;
   removing said constituent from said liquid; and
   directing said liquid toward said semiconductor workpiece, wherein said step of directing said liquid toward said semiconductor workpiece comprises directing said liquid toward a process tank housing said semiconductor workpiece;
   exposing said liquid to an additional amount of said constituent after said step of directing said liquid, wherein said step of exposing said liquid to a constituent comprises overflowing said process tank;
   removing said additional amount of said constituent from said liquid; and
   redirecting said liquid toward said semiconductor workpiece.

8. A method of addressing gas contamination in a recirculation bath liquid, comprising:
   permitting a gas to dissolve into said liquid after a first treatment of a semiconductor workpiece with said liquid; and
   removing said gas from said liquid before a second treatment of said semiconductor workpiece with said liquid, wherein removing occurs in a location proximate to that of said permitting step.

9. The method in claim 8, further comprising a step of removing said gas from said liquid before said first treatment.

10. A method of controlling exposure of a process liquid to a semiconductor wafer, comprising:
    bringing said process liquid into a fabrication environment;

allowing said process liquid to gasify in said fabrication environment; and degasifying said process liquid before an exposure of said process liquid to said wafer, wherein said degasifying occurs in said fabrication environment.

11. The method in claim 10, wherein said step of allowing said process liquid to gasify comprises carrying out a first exposure of said process liquid to said wafer; and wherein said degasifying step comprises degasifying said process liquid before a second exposure of said process liquid to said wafer.

12. A method of regulating gas contamination in a semiconductor fabrication housing, comprising:

allowing a first gas within said semiconductor fabrication housing to contact a liquid;

separating said first gas from said liquid while said liquid is within said semiconductor fabrication housing; and exposing said liquid to a workpiece.

13. The method in claim 12, wherein said step of allowing a first gas within said semiconductor fabrication housing to contact a liquid comprises allowing contact with a selection of a gas ambient to a semiconductor fabrication housing atmosphere and a gas resulting from a fabrication chemical reaction.

14. The method in claim 12, wherein said step of exposing said liquid to a workpiece comprises allowing an additional amount of said first gas to contact said liquid; and wherein said method further comprises a step of separating said additional amount of said first gas from said liquid.

15. The method in claim 12, wherein said step of exposing said liquid to a workpiece comprises allowing a second gas within said semiconductor fabrication housing to contact said liquid; and wherein said method further comprises a step of separating said second gas from said liquid.

* * * * *